United States Patent [19]

Chisholm

[11] Patent Number: 4,467,523

[45] Date of Patent: Aug. 28, 1984

[54] METHODS OF AND APPARATUS FOR INSERTING PINS INTO A SUBSTRATE

[75] Inventor: William M. Chisholm, Midlothian, Va.

[73] Assignee: AT&T Technologies, Inc., New York, N.Y.

[21] Appl. No.: 326,102

[22] Filed: Nov. 30, 1981

[51] Int. Cl.³ .................... H05K 3/00; B23P 23/00
[52] U.S. Cl. ................................ 29/845; 29/564.6; 29/747
[58] Field of Search ............. 29/739, 747, 845, 564.6, 29/750, 758, 762, 764; 269/40, 43, 287

[56] References Cited

U.S. PATENT DOCUMENTS

| | | | |
|---|---|---|---|
| 3,456,325 | 7/1969 | Langlois et al. | 29/739 X |
| 3,559,267 | 2/1971 | Castellani . | |
| 3,664,015 | 5/1972 | Bakermans . | |
| 3,699,631 | 10/1972 | Shughart . | |
| 3,807,045 | 4/1974 | Bennett et al. . | |
| 3,875,636 | 4/1975 | Shultz, Jr. et al. | 29/747 X |
| 3,946,477 | 3/1976 | Cobaugh et al. . | |
| 4,216,580 | 8/1980 | Chisholm . | |
| 4,265,508 | 5/1981 | Chisholm . | |
| 4,266,543 | 5/1981 | Chisholm | 29/739 |

OTHER PUBLICATIONS

Western Electric *Technical Digest*, No. 56, Oct. 1979, pp. 9-10.

*Primary Examiner*—Mark Rosenbaum
*Assistant Examiner*—Carl J. Arbes
*Attorney, Agent, or Firm*—J. B. Hoofnagle

[57] ABSTRACT

A plurality of pins (20) are supported by a shuttle (42) with shanks (21) of the pins extending freely from the shuttle. The shuttle (42) is manipulated to insert the shanks (21) into a pin-insertion head (127). The shuttle (42) is then withdrawn from the pins (20) whereby shanks (22) of the pins extend freely from the head (127). The head (127) is then moved toward a board (24) to insert the pins (20) into apertures (23) of the board.

27 Claims, 20 Drawing Figures

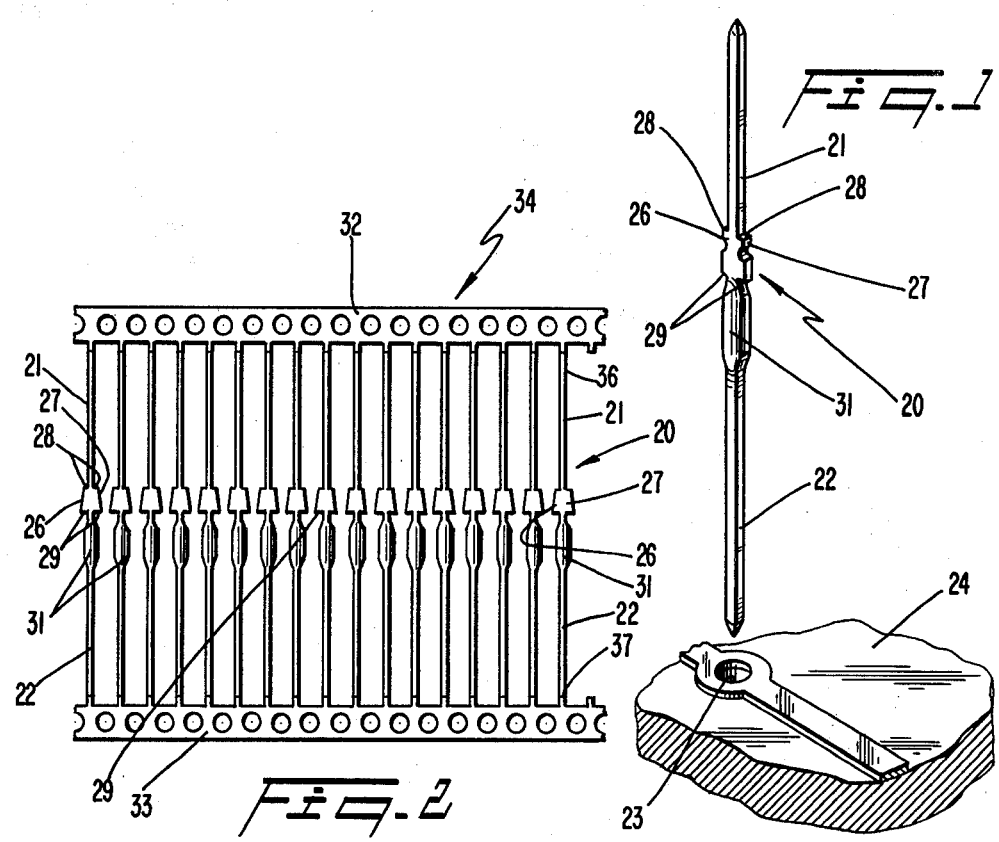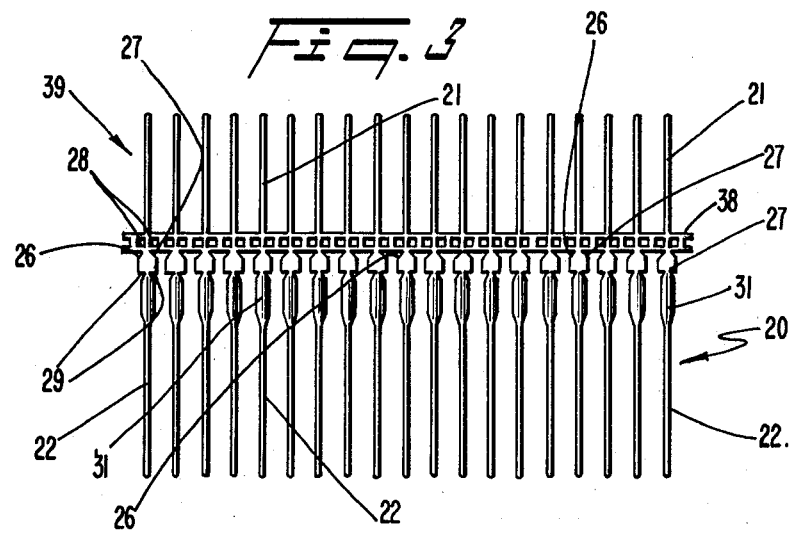

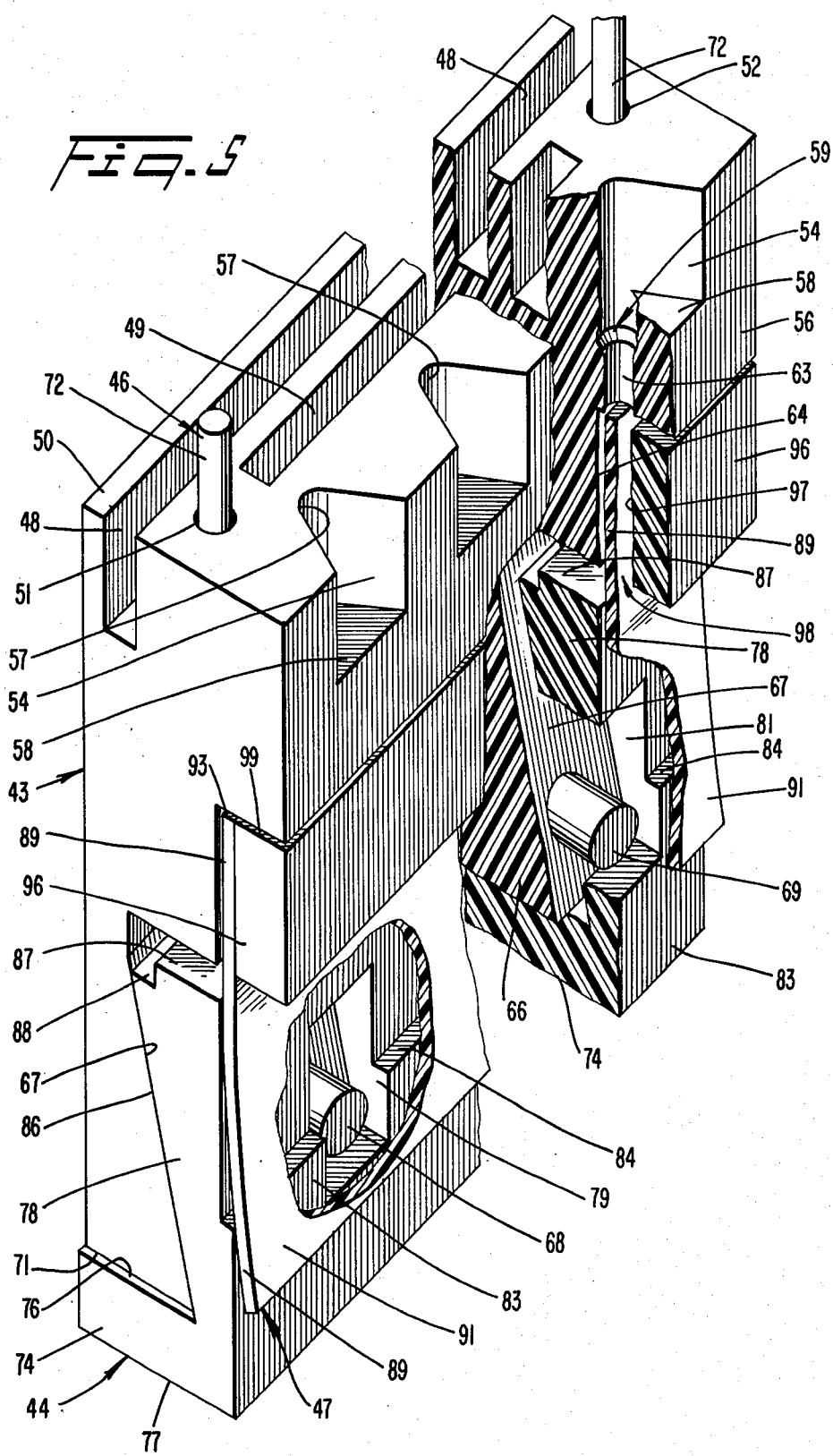

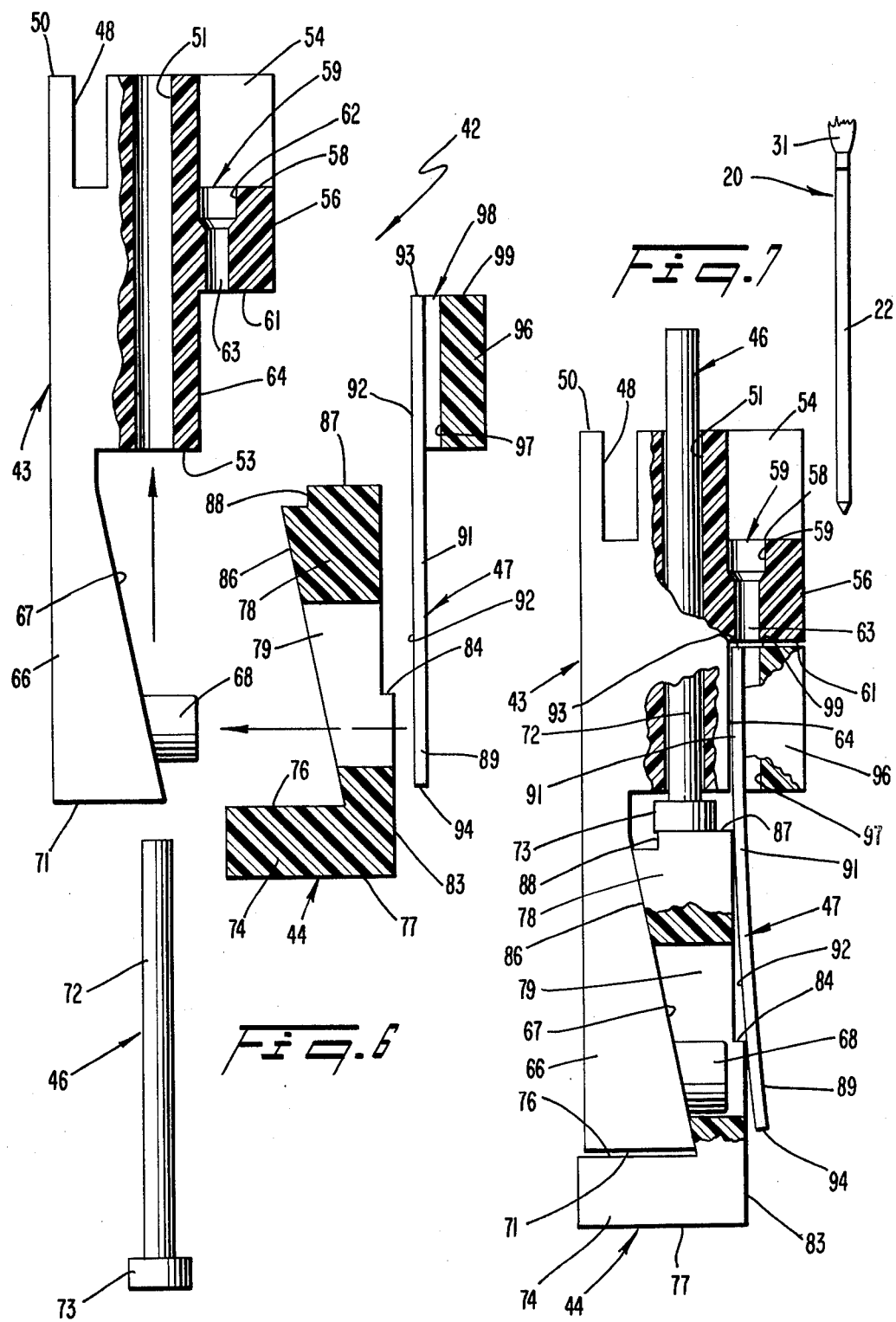

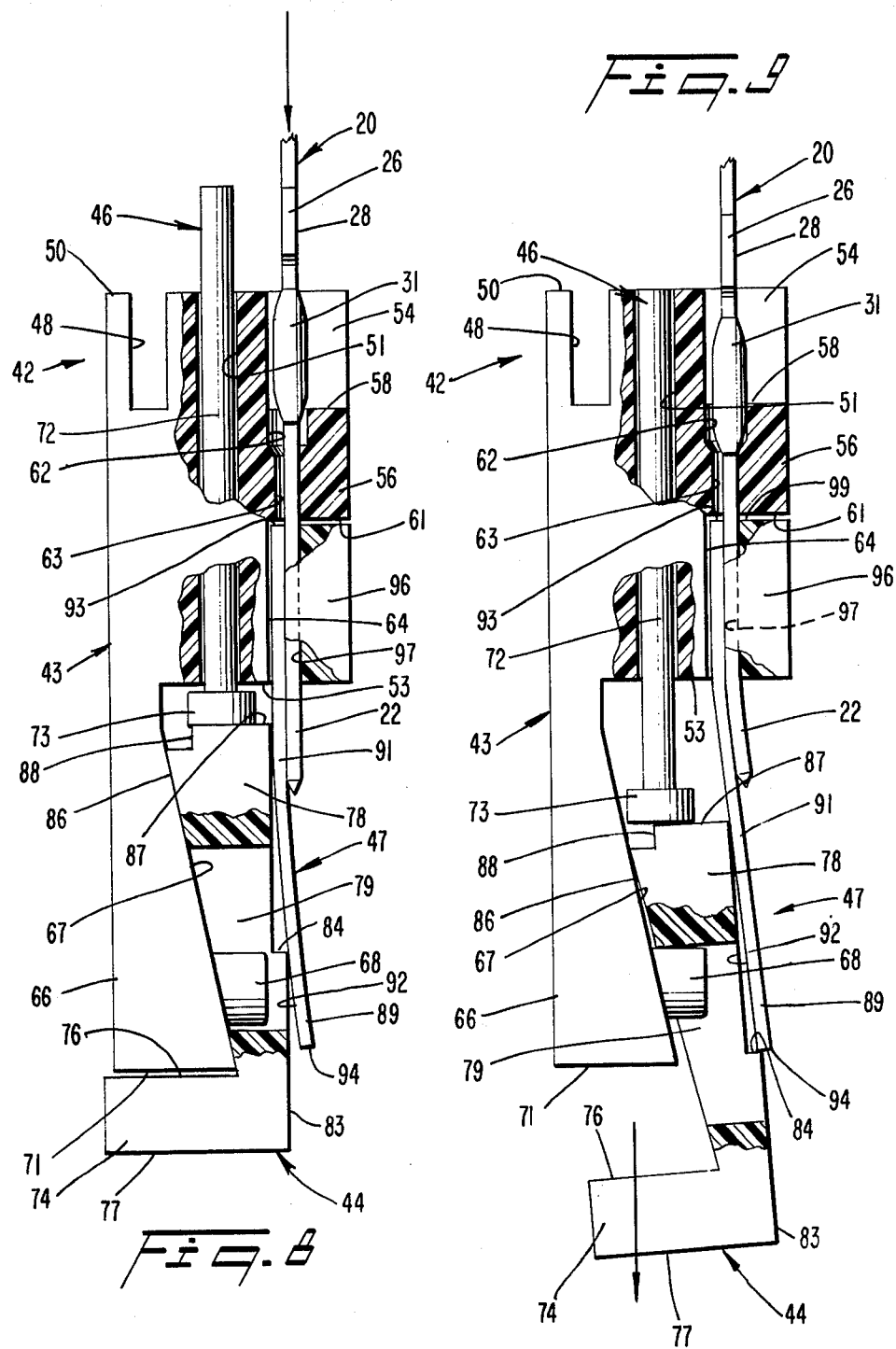

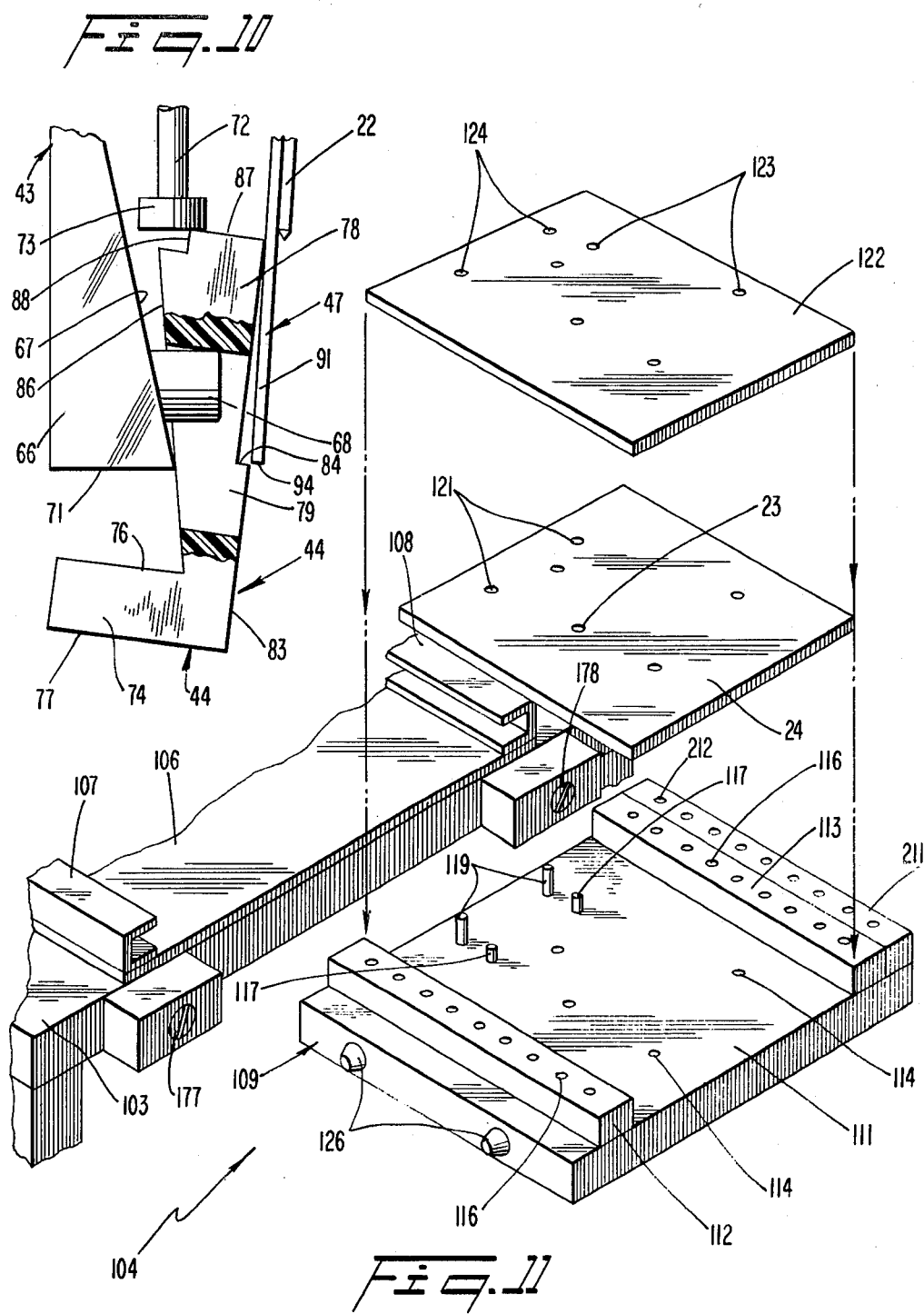

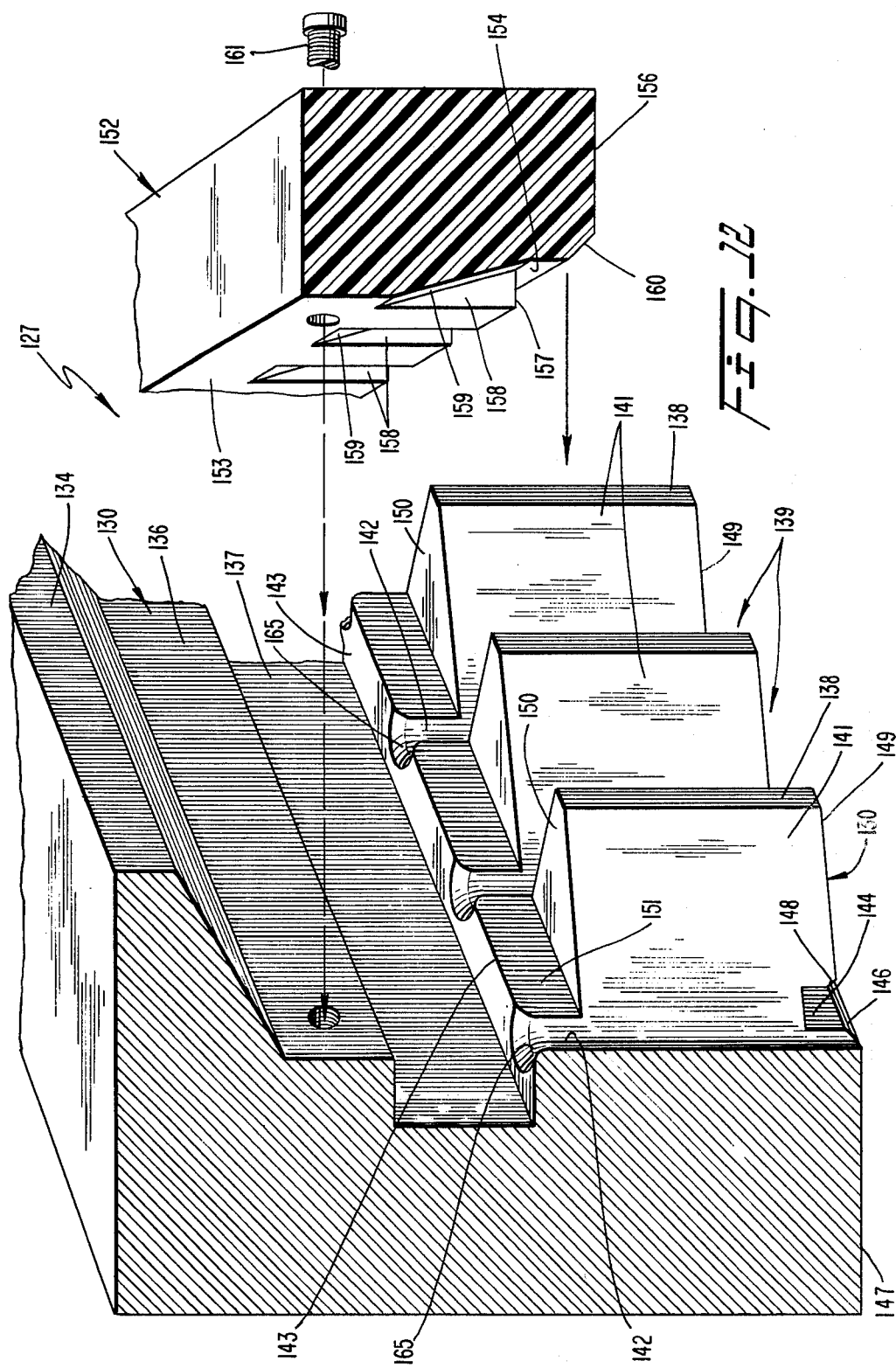

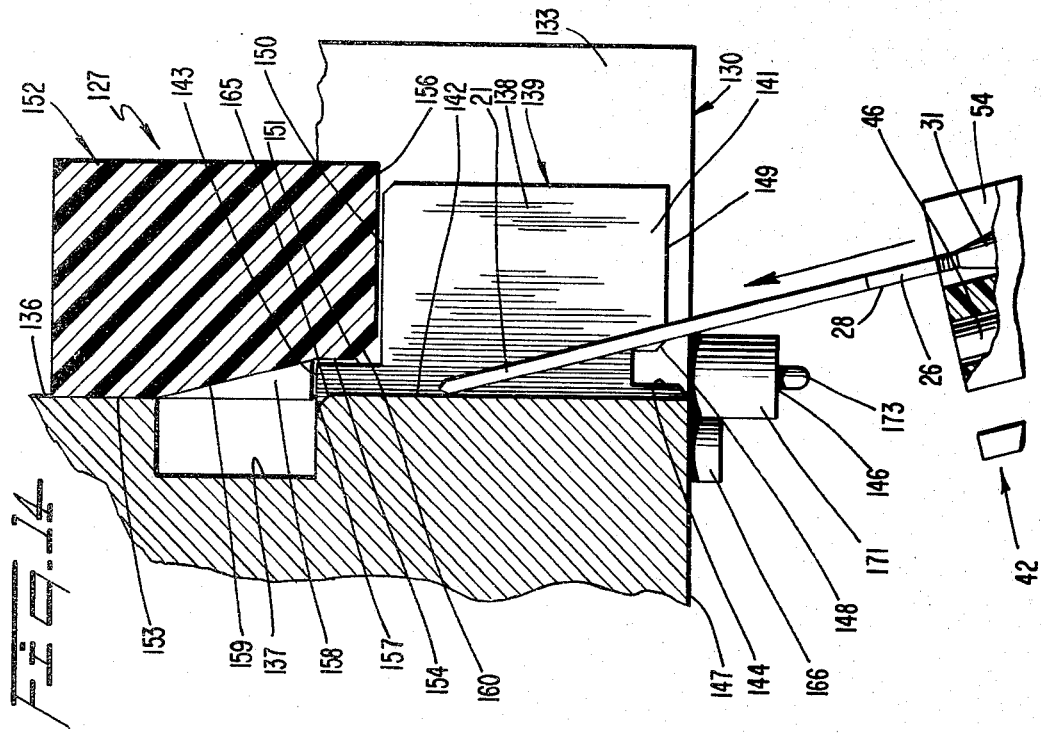
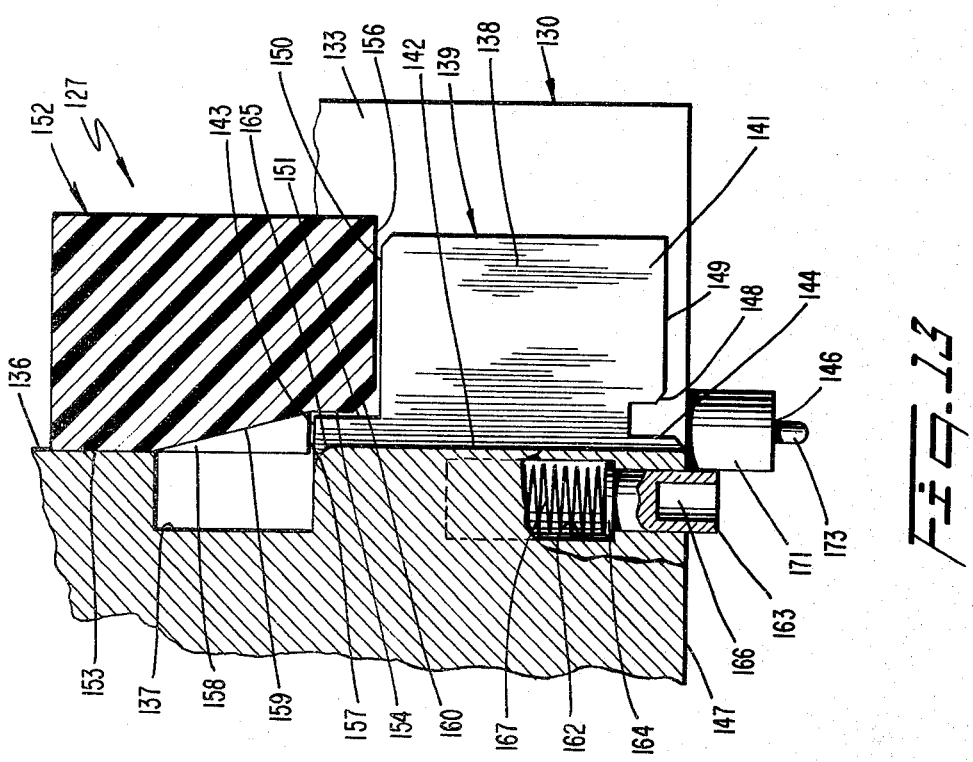

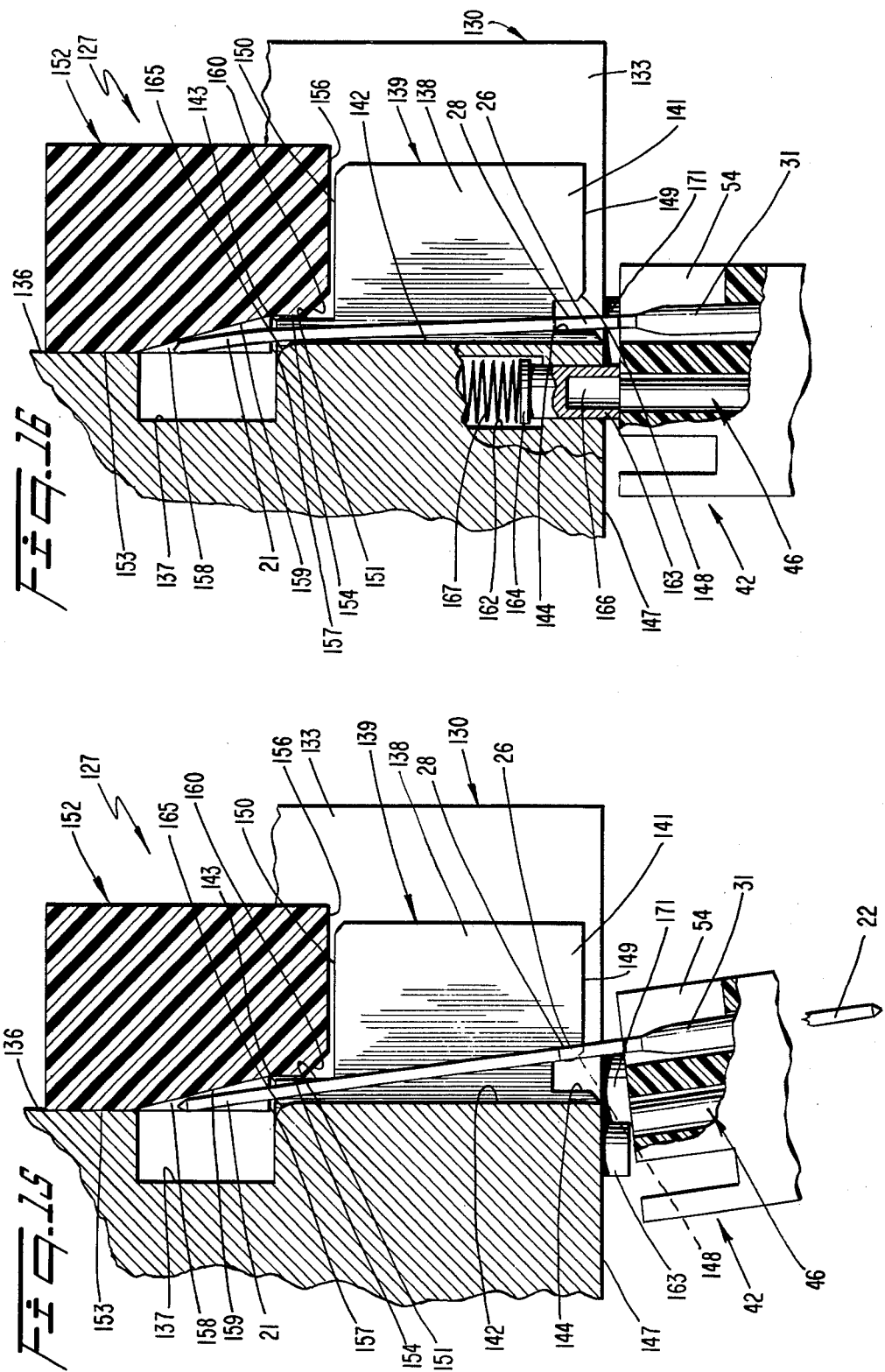

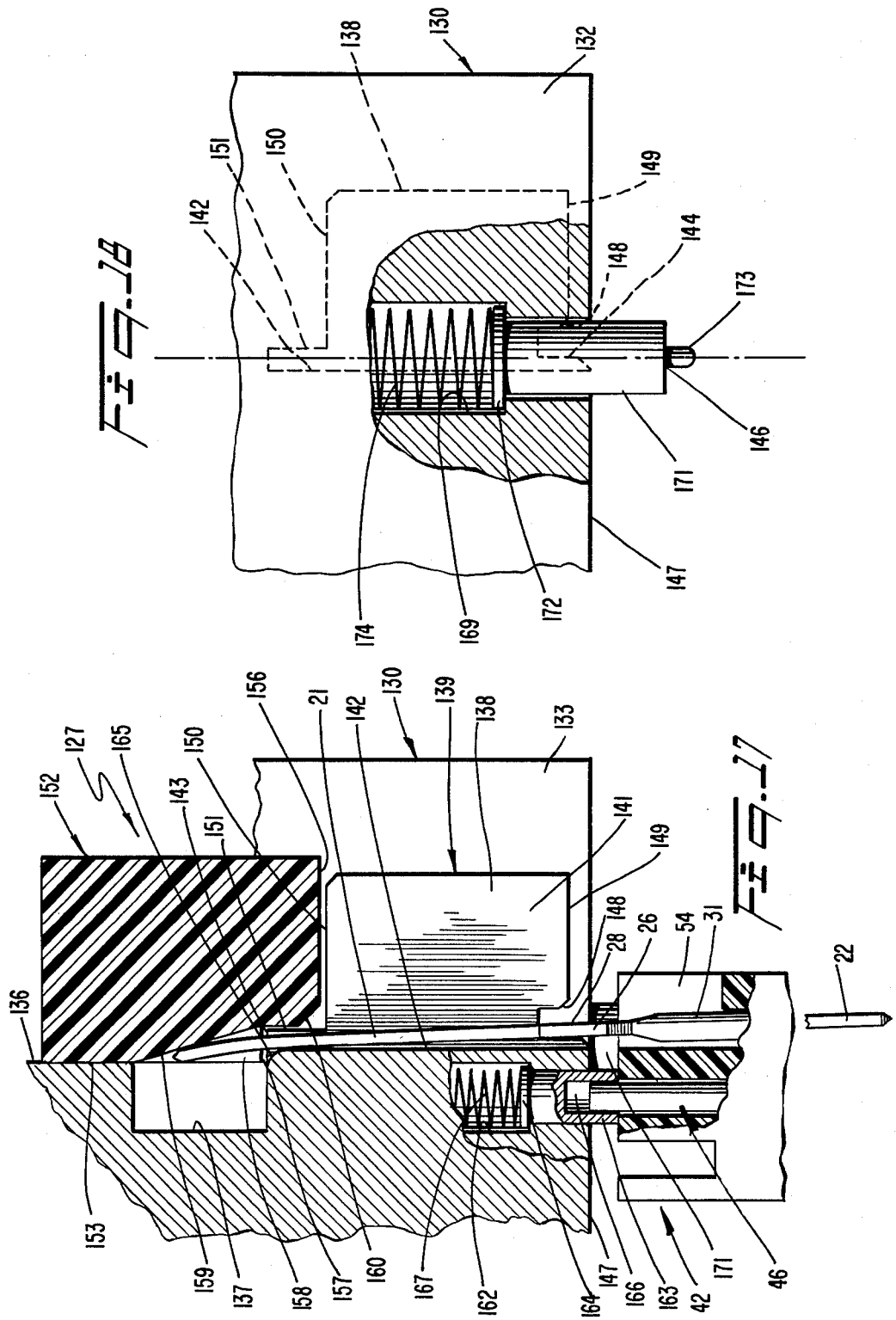

4,467,523

METHODS OF AND APPARATUS FOR INSERTING PINS INTO A SUBSTRATE

TECHNICAL FIELD

This invention relates to methods of and apparatus for inserting pins into a substrate and particularly to methods of and apparatus for gang-inserting a plurality of pins into apertures of a substrate.

BACKGROUND OF THE INVENTION

In the manufacture of some types of rigid pin-populated printed wiring boards, terminal pins are inserted into apertures formed in the board and electrically engage portions of printed wiring on the boards to provide for connections to electrical circuits. Typically, the spacing between adjacent apertures is extremely small. For example, the spacing between apertures on one board is 0.125 inch. Moreover, each terminal pin typically has a square cross section of, for example, 0.025 inch except in those areas where the pin is formed with lateral ears having a push shoulder and an aperture-engaging portion intermediate the ends thereof.

Due to the close spacing between apertures and the small size of the pin, it is most difficult and tedious to assemble the pins on an individual basis. Additionally, the relatively small size of the pins necessitates delicate handling prior to and during insertion of the pins into the apertures. However, where each board may contain thousands of closely-spaced apertures, efficiency and economy dictate that the pins be prealigned and gang-inserted into the board apertures.

In the past, many techniques have been developed to facilitate the handling of the pins prior to insertion into the board apertures. For example, in one technique, the pins are stamped in a linked configuration having an integrally formed edge-strip carrier. The pins are then fed into an insertion machine in the linked configuration and are separated individually from the carrier. Each of the separated pins is fed individually and independently of the other separated pins through feed chutes and assembled with a supporting structure. In another example, the linked pins are fed to an insertion machine and are separated serially from the carrier. Thereafter, each pin is inserted into the board immediately after being separated from the carrier.

In another technique, pins are formed from sheet stock in a parallel array with opposite ends of the terminal pins interconnected by opposed parallel side rails to form a terminal strip. In an assembling operation, one of the side rails is separated from insertion ends of the pins ad the other side rail may be used as a pusher member to insert the separated ends into apertures in a printed wiring board. After the assembling operation, the remaining side rail is separated from the opposite ends of the terminal pins. In an alternate technique, one of the side rails is removed and the pins are assembled with an insertion apparatus. After the assembly with the apparatus, the other side rail is removed from the pins. The insertion of the pins into the board is then accomplished utilizing push shoulders formed on intermediate portions of the pins.

In still another technique, a terminal pin strip includes terminal pins which are interconnected adjacent respective ones of their ends by a removable side rail. Adjacent terminal pins are further interconnected intermediate their ends by a strip member which may be utilized to provide an electrical connection between two or more adjacent terminal pins after the pins have been assembled with a supporting structure. When adjacent terminals are not to be electrically interconnected, the linking strip member must also be severed which is independent of the pins being carried therewith.

Another technique for assembling pins with a substrate is disclosed in U.S. Pat. No. 4,216,580 which issued to W. M. Chisholm on Aug. 12, 1980. As disclosed in U.S. Pat. No. 4,216,580, a plurality of pins are held at opposite ends by carrier strips in an aligned parallel spacing. The pins are positioned adjacent to nests of a stationary jaw of a pin applicator. A movable jaw moves the pins into the nests where an upper carrier strip engages a stripper bar and is separated from the pins. Upon continued motion of the movable jaw, the pins are clamped within the nests between the movable and stationary jaws. The lower strip is then separated from the pins so that the pins are now individually held in by the pin applicator in the aligned parallel spacing. The pin applicator is then moved downwardly to insert the individual pins into apertures of a prepositioned board.

SUMMARY OF THE INVENTION

This invention contemplates methods of and apparatus for inserting pins into a support. Initially, a plurality of individual pins are supported in a precise spaced alignment with common tip ends of the pins extending freely in the spaced alignment. While supported, the freely extending common tip ends of the pins are wedged into fixed passageways of a head so that the pins are firmly supported with the head. The initial supporting of the pins is removed so that the opposite common tip ends of the pins extend freely in the spaced alignment. The head is then moved toward the support until the opposite end of each of the pins is inserted into an aperture of the support.

BRIEF DESCRIPTION OF THE DRAWINGS

FIG. 1 is a perspective view showing a terminal pin;

FIG. 2 is a front view showing a plurality of pins of FIG. 1 held in a uniform spacing by end-carrier strips;

FIG. 3 is a front view showing a plurality of pins of FIG. 1 held in a uniform spacing by body-carrier strips;

FIG. 5 is a perspective view showing a pin-supporting shuttle;

FIG. 6 is an exploded view showing the elements of the pin-supporting shuttle of FIG. 5;

FIGS. 7 through 10 are side views of the pin-supporting shuttle of FIG. 5 showing the shuttle in various positions;

FIG. 11 is a partial perspective exploded view showing a substrate slide support associated with the pin-insertion apparatus of FIG. 4;

FIG. 12 is a partial perspective view showing elements of a insertion head which forms a portion of the pin-insertion apparatus of FIG. 4;

FIGS. 13 through 18 are partial side views of the insertion head of FIG. 12 showing the relationship between the various elements thereof;

DETAILED DESCRIPTION

Figure 4:
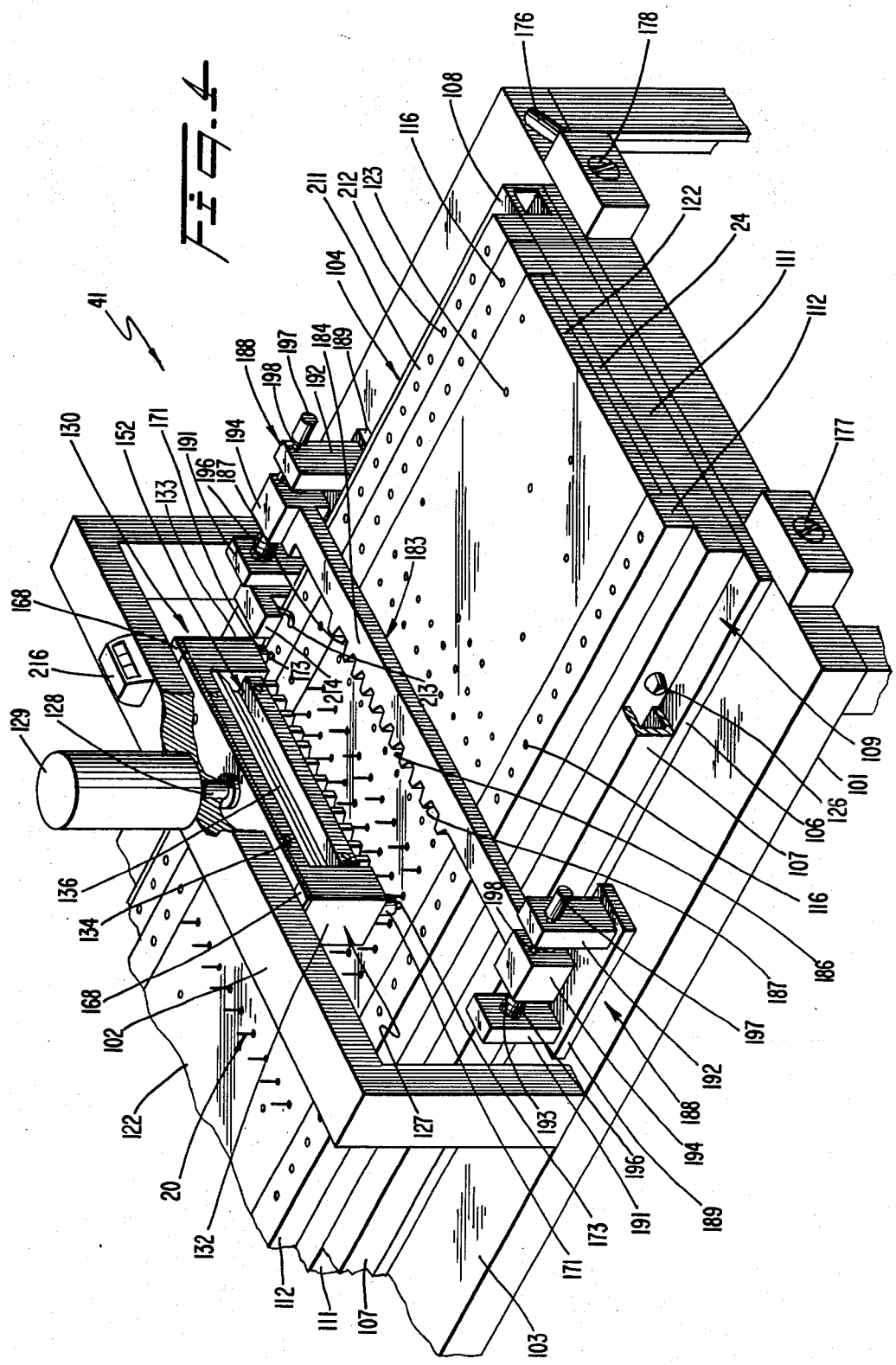
FIG. 4 is a perspective view showing a pin-insertion apparatus embodying certain principles of the invention.

Referring to FIG. 1, there is illustrated a terminal pin, designated generally by the numeral 20. The terminal pin 20 is formed from blank stock (not shown) to include axially aligned shanks 21 and 22 at opposite ends thereof. The end of shank 22 is to be inserted into one of a plurality of apertures 23 of a printed wiring board 24 while the end of shank 21 extends from the board for receiving a connector housing (not shown). Typically, the apertures 23 are arranged in a matrix pattern of rows and columns. Lateral ears 26 and 27 are formed intermediate the ends of the pin 20 adjacent shank 21 and include shoulder or push surfaces 28 closest to shank 21 and undersurfaces 29 closest to shank 22. The pin 20 is also formed with a board-engaging, pin-retaining portion 31 which is eventually located within one of the apertures 23 of the printed wiring board 24 and is designed to facilitate retention of the pin with the board but also permit the pin to be removed from the aperture.

Referring to FIG. 2, there is illustrated a plurality of terminal pins 20 which have been formed in a predetermined uniform spacing from blank stock (not shown) during a punching and stamping operation. The pins 20 are held in the uniform spacing by integrally attached end-carrier strips 32 and 33 also formed from the blank stock in the same punching and stamping operation. The pins 20 and end-carrier strips 32 and 33 form an end-carried pin comb, designated generally by the numeral 34. The ends of shanks 21 and 22 and the pins 20 which are linked integrally with the end-carrier strips 32 and 33, respectively, are scored at points 36 and 37, respectively, to facilitate subsequent easy removal of the strips from integral attachment with the pins.

Referring to FIG. 3, there is illustrated a plurality of terminal pins 20 which have been formed in a predetermined uniform spacing from blank stock (not shown) during a punching and stamping operation. The pins 20 are held in the uniform spacing by integrally formed, intermediate or body-carrier webs or strips 38 also formed from the blank stock in the same punching and stamping operation. The pins 20 and the strips 38 form a body-carried pin comb designated generally by the numeral 39. Each of the pins 20 of comb 39 also include shanks 21 and 22, lateral ears 26 and 27, shoulder or push surfaces 28, undersurfaces 29 and pin-retaining portion 31. Upper portions of the lateral ears 26 and 27 are linked integrally with strips 38. The strips 38 could be scored to facilitate easy removal thereof whereby the mechanical stability of the pins 20 is enhanced.

Referring to FIG. 4, there is illustrated a pin-insertion apparatus designated generally by the numeral 41. The apparatus 41 receives a plurality of the pins 20 in an aligned and spaced array consistent with the alignment and spacing of the pins of combs 34 and 39 illustrated in FIGS. 2 and 3, respectively, but with the strips 32, 33 and 38 removed. Thereafter, the pins 20 are inserted into apertures 23 of the board 24.

Referring to FIGS. 5 through 9, there is illustrated a pin-supporting shuttle, designated generally by the numeral 42. The shuttle 42 supports the plurality of pins 20 in the spaced alignment illustrated in FIGS. 2 and 3 during a period when the strips 32, 33 (FIG. 2) and 38 (FIG. 3) are being removed and as the pins are being assembled with the pin-insertion apparatus 41 (FIG. 4).

Referring to FIG. 6, the shuttle 42 includes a main body, designated generally by the numeral 43 and a wedge slide, designated generally by the numeral 44. The shuttle 42 further includes a pair of pins or actuators, designated generally by the numeral 46, and a pin-wedging member, designated generally by the numeral 47. The main body 43 is formed with a pair of slots 48 and 49 in an upper face 50 thereof. Slot 48 extends from side to side of the body 43 while slot 49 is closed along the sides and at opposite ends thereof. A pair of spaced holes 51 and 52 (FIG. 5) are formed through an intermediate portion of the body 43 and extend from the upper face 50 to an intermediate undersurface 53. A plurality of spaced slots 54 are formed in the upper face 50 of the body 43 and extend downwardly along a side face 56 thereof. As more clearly illustrated in FIG. 5, each of the slots 54 are formed with a wide opening in the side face 56 which converges inwardly of the body 43 to a rear surface 57 of the slot. Each slot 54 is formed with a base 58 which is parallel with the upper face 50 of the body 43.

A hole, designated generally by the numeral 59, is formed in the base 58 of each slot 54 and is formed through to an undersurface 61 of the body 43. Each hole 59 is formed with an upper portion 62 and a lower portion 63. The upper portion 62 of each hole 59 is circular and larger than the cross section of shank 22 of pin 20 (FIG. 1). The lower portion 63 of each hole 59 is also circular and larger than the cross section of shank 22 of pin 20 but the diameter of portion 63 is smaller then the diameter of portion 62.

The body 43 is formed with a recessed side face 64 which is between and contiguous with the undersurfaces 53 and 61. Further, the body 43 is formed with a downwardly extending portion 66 having a tapered surface 67. A pair of projections 68 and 69 (FIG. 5) extend outwardly from the surface 67. In addition, the portion 66 of the body 43 is formed with an undersurface 71.

Each of the actuators 46 is formed with a shank 72 and a head 73 at one end. The actuators 46 are assembled with the body 43 by inserting the shanks 72 into the holes 51 so that the free ends of the shanks can protrude from the holes adjacent to the upper face 50 as illustrated in FIG. 5. As illustrated in FIGS. 7, 8 and 9, the head 73 of each of the actuators 46 is thereby located within a space immediately below the undersurface 53 and above the tapered surface 67 of the body 43. The diameters of holes 51 and 52 are barely larger than the diameter of shanks 72 of actuators 46 to provide for a slip fit of the shanks within the holes. Thus, once the shanks 72 have been inserted into the holes 51 and 52, the actuators 46 will be frictionally retained in the assembled position and will require an external force to reposition the shanks within the holes.

Referring to FIG. 6, the wedge slide 44 is formed with a lower ledge portion 74 having an upper surface 76 and a lower surface 77. The slide 44 is further formed with a wedge portion 78 having a pair of openings 79 and 81 (FIG. 5). The wedge portion 78 is formed with front surfaces 82 and 83, which are offset by a shoulder 84, and with a tapered rear surface 86. The wedge portion 78 is formed with an upper surface 87. A clearance notch 88 is formed along the edge of the wedge portion contiguous to tapered surface 86 and upper surface 87.

Referring to FIG. 5, the slide 44 is assembled with the body 43 whereby the projections 68 and 69 of the body are located within the openings 79 and 81, respectively, of the slide. Referring to FIG. 7, tapered surfaces 67 and 86 of body 43 and slide 44, respectively, are brought into face-to-face relationship. Also, undersurface 71 of body 43 and upper surface 76 of slide 44 are brought into face-to-face relationship. Upper surface 87 of slide 44 is located adjacent to heads 73 of actuators 46 to capture the heads between the upper surface 87 and the undersurface 53 of body 43.

Referring to FIGS. 5 and 6, the pin-wedging member 47 includes a thin, flexible plate 89 having major front and rear surfaces 91 and 92, respectively, and upper and lower surfaces 93 and 94, respectively. The pin-wedging member 47 further includes a pin guide 96 formed with a plurality of spaced, parallel slots 97 corresponding in number and spacing to the number and spacing of slots 54 formed on the body 43. The pin guide 96 is secured to the upper portion of the front face 91 of plate 89 to enclose slots 97 and provide passageways 98 generally of a configuration and size comparable to the cross section of the shank 22 of pin 20 (FIG. 1). The pin guide 96 is formed with an upper surface 99 which is coplanar with upper surface 93 of plate 89.

The pin-wedging member 47 is assembled with body 43 by securing an upper portion of rear surface 92 of the member to side face 64 of the body and by placing upper surfaces 93 and 99 of the member into facing engagement with undersurface 61 of the body. As illustrated in FIGS. 5, 7, 8 and 9, the passageways 98 of pin-wedging member 47 are aligned with the holes 59 of body 43. As illustrated in FIGS. 5 and 7, as the pin-wedging member 47 is assembled with body 43, an intermediate portion of the rear surface 92 of the member rests against front surface 83 of slide 44 adjacent to shoulder 84.

The body 43, wedge slide 44 and pin-wedging member 47 of shuttle 42 are each composed of a suitable plastic such as polycarbonate and are molded in a conventional manner to provide strength and flexibility where needed. The actuators 46 are composed of a high-strength metal such as drill rod.

Referring to FIG. 7, when the body 43, slide 44, actuators 46 and member 47 have been assembled to form shuttle 42, the heads 73 of the actuators are captured between undersurface 53 of the body ad upper surface 87 of the slide. Since the pin-wedging member 47 is assembled and secured to the body 43 after the slide 44 has been assembled, the lower portion of the flexible plate 89 facilitates the capturing of the slide between the plate and the portion 66 of the body. However, since the slide 44 is not fixed secured to any other portion of the shuttle 42, the slide is movable along the tapered surface 67 of body 43 and limited in travel by relative movement of projections 68 and 69 (FIG. 5) within openings 79 and 81 (FIG. 5), respectively. Thus, as illustrated in FIG. 7, slide 44 is located in an inserted position wherein the tip end of the shank 72 of actuator 46 extends outwardly from the upper face 50 of body 43.

In use of shuttle 42, one of the combs 34 and 39 of pins 20, as illustrated in FIGS. 2 and 3, respectively, is positioned for assembly with shuttle 42. If the comb 34 of pins 20 is selected, the end carrier strip 33 is positioned into slot 48 of shuttle 42 and the comb is flexed to sever the strip from the pins 20 along the scored points 37. Shanks 22 of pins 20 now appear as free ends of comb 34. Comb 34 is then manipulated so that the lower free ends of shanks 22 are spaced from but generally aligned with slots 54 of shuttle 42 as viewed in FIG. 7. Generally, the tips of shanks 22 should be in the plane of the bases 58 of slots 54. Thereafter, the comb 34 is moved laterally toward the shuttle 42 whereby the lower free ends of the shanks 22 move into the adjacent slots 54 and seat at the rear surfaces 57 thereof. The wide openings of slots 54, as illustrated in FIG. 5, permit an operator to generally align the shanks 22 with the slots prior to assembly, rather than having to precisely align the shanks with the rear surfaces 57. The converging side walls of the slots 54 assist the operator in precisely locating the lower ends of the shanks 22 at the rear surfaces 57 of the slots by laterally guiding the shanks as they are moved toward the rear surfaces.

Referring to FIG. 8, after the lower ends of the shanks 22 have been seated in the rear surfaces 57 of slots 54, the comb 34 is moved to insert the lower ends of the shanks through the holes 59 and passageways 98. As the tip ends of the shanks 22 pass through the circular portions 62 and 63 of holes 59, the tip ends are guided into a narrowing throughway formed by the portions in preparation for entering the shank-cross-section conforming passageways 98. The tip ends of the shanks 22 are eventually moved through the passageways 98 and into engagement with the extended portions of front surface 91 of plate 89 whereby the shanks are moved slightly laterally of the axis of the pins. Eventually, undersurfaces 29 of lateral ears 26 and 27 (FIG. 2) of the pins 20 come to rest on the upper surface 50 of shuttle 42 adjacent to the slots 54 and the pins are now fully assembled with the shuttle.

Thereafter, as illustrated in FIG. 9, slide 44 is moved to a fully withdrawn position. This is accomplished by pushing the tip ends of actuator shanks 72 (FIG. 7) into the holes 51 and 52 whereby actuator heads 73 press against upper surface 87 of slide 44 to move the slide toward the withdrawn position. Also, as slide 44 moves to the withdrawn position, projections 68 and 69 (FIG. 5) move relatively within openings 79 and 81 (FIG. 5), respectively, to the position illustrated in FIG. 9, as limited by the size of the openings. When slide 44 reaches the withdrawn position of FIG. 9, the flexible plate 89 snaps into a position whereby the lower surface 94 of the plate rests on shoulder 84 of the slide. Since projections 68 and 69 are now in the uppermost position within openings 79 and 81, respectively, slide 44 can not be moved downwardly any further. Also, since lower surface 94 of plate 89 is resting on shoulder 84 of slide 44, the slide can not be moved upwardly any further. Therefore, the elements of of shuttle 42 are now locked in the position illustrated in FIG. 9. As the slide 44 is moved to the withdrawn position, plate 89 is flexed outwardly toward shanks 22 to acutely and laterally deflect the shanks and firmly wedge the pins 20 with the shuttle. The shuttle 42 can now be manipulated without concern for the pins 20 separating therefrom. Thereafter, strip 32 (FIG. 2) can be removed along scored points 36 whereby the pins 20 are now held individually by the shuttle in a desired spacing and alignment.

In order to release the pins 20 from the shuttle 42, the slide 44 is rocked as illustrated in FIG. 10. As the slide 44 is rocked, the upper corner of front surface 82 of the slide engages the rear surface 92 of plate 89 and urges the plate outwardly away from the slide. This action results in the lower surface 94 of plate 89 moving away from the shoulder 84 of slide 44 whereby relative movement between the slide and the body 43 can occur. Thereafter, the slide 44 and body 43 are moved relatively so that the slide and body assume the position illustrated in FIG. 8. In this position, plate 89 is now relaxed or flexed inwardly toward slide 44. The lower ends of shanks 22 are still in engagement with the front surface 91 of plate 89. However, the wedging action of the shanks 22 with plate 89, as illustrated in FIG. 8, has been relaxed considerably and to the extent that pins 20 may be removed from the shuttle 42 with minimum effort.

Comb 39 (FIG. 3) of pins 20 is assembled with shuttle 42 in a manner identical to that described above with respect to comb 34 (FIG. 2). After the pins 20 of comb 39 have been assembled with shuttle 42, the body-carrier strips 38 (FIG. 3) are removed whereby the pins are retained individually by the shuttle in the same spaced alignment of the comb.

The shuttle 42 is also disclosed in, and is claimed in, a continuation-in-part application filed in the name of W. M. Chisholm on even date herewith, assigned to the assignee of record herein and assigned Ser. No. 326,103, now U.S. Pat. No. 4,398,628. This continuation-in-part application is incorporated herein by reference thereto.

Referring again to FIG. 4, the pin-insertion apparatus 41 includes a table 101 and a stand 102 mounted on a top surface 103 of the table. A substrate slide support, designated generally by the numeral 104, is also mounted centrally on the top surface 103 of table 101. Referring to FIGS. 4 and 12, the substrate slide support 104 includes a plastic sheet 106 composed of a material which will permit sliding movement thereover with relative ease. The support 104 further includes a pair of spaced guide channels 104 and 108 mounted on and along opposite edges of the sheet 106 and extending from the front to the rear of table 101. The channels 107 and 108 have channel openings which are in interfacing relationship.

Referring to FIG. 11, a slide assembly, designated generally by the numeral 109, includes a base template 111 and a pair of index bars 112 and 113 mounted on top of and along opposite edges of the template. The template 111 is formed with a plurality of holes 114 which are larger in diameter than the cross section of the shank 22 of pin 20 (FIG. 1). The holes 114 are arranged in a matrix pattern of rows and columns consistent with the matrix arrangement of the apertures 23 in board 24 (FIGS. 1 and 11) with rows of holes extending from one side of the template to the opposite side. The index bars 112 and 113 are each formed with a plurality of index holes 116 with each bar having one hole aligned with each row of holes 114 in the template. In this manner, an index hole 116 is located at opposite ends of each row of template holes 114. A pair of spaced, guide pins 117 are mounted in and extend upwardly from surface 118 of template 111 a distance equal to the thickness of board 24. A second pair of spaced guide pins 119 also extend from surface 118 of template 111 a distance greater than the thickness of the board 24.

As illustrated further in FIG. 11, the printed wiring board 24 is formed with two guide holes 121 which are positionable over guide pins 117 as the board is positioned on top of template 111 and between blocks 112 and 113. It is noted that guide pins 117 do not extend beyond board 24. The slide assembly 109 also includes cover plate 122 which is formed with a plurality of holes 123 arranged in a matrix pattern of rows and columns consistent with the matrix arrangement of the apertures 23 in board 24. Cover plate 122 is composed of a high-impact clear plastic material such as polycarbonate. Each of the holes 123 of cover plate 122 are of a diameter which is slightly greater than the distance between the outer edges of the lateral ears 26 and 27 of pin 20 (FIG. 1). Cover plate 122 is also formed with a pair of guide holes 124 which fit over guide pins 119 when the cover plate is positioned on top of the board 24 already assembled on the template 111. In the assembled condition, the upper surface of cover plate 122 is flush with the upper surfaces of blocks 112 and 113. Also, cover plate holes 123, board apertures 23 and template holes 114 are axially aligned and arranged in the same matrix pattern as noted above. Further, each row of cover plate holes 123 is aligned at opposite ends of the row with holes 116 in the bars 112 and 113.

The slide assembly 109 also includes two pairs of guide elements 126 (one pair shown) with each pair attached to opposite sides of the template 111 which fit into and are movable within the channels 107 and 108. When the slide assembly 109 is positioned between the channels 107 and 108, the undersurface of the template 111 rests on and is movable over the upper surface of the plastic sheet 106 with relative ease.

Referring to FIG. 4, the apparatus 41 further includes an insertion head designated generally by the numeral 127 which is attached for movement to a rod 128 of a pneumatic cylinder 129. The insertion head 127 includes a pin-guiding member, designated generally by the numeral 130, formed with a pair of spaced, end columns 132 and 133 integrally joined with a cross beam 134. The insertion head 127 is formed with a recessed surface 136 between the columns 132 and 133 and below the beam 134.

Referring to FIG. 12, the recessed surface 136 of the pin-guiding member 130 is formed with an open-sided chamber 137 which extends between columns 132 and 133 (FIG. 4). In addition, a plurality of guide elements 138 extend outwardly from a lower portion of the cross beam 134 below the chamber 137. The guide elements 138 are spaced apart to provide a plurality of slots 139 and are formed with tapered side walls 141 to provide for a wide entry opening of each slot. The slots 139 correspond in number and spacing to the number and spacing of pins 20 contained on combs 34 (FIG. 2) or 39 (FIG. 3) and the number and spacing of slots 54 of shuttle 42 (FIG. 5).

The opposed tapered walls 141 of each slot 139 converge inwardly to a groove 142 at the base of the slot. The upper end of each groove 142 extends into a ledge surface 143 which extends outwardly from chamber 137. The upper rear edge of each groove 142 is rounded as illustrated in FIGS. 12 through 17. Referring further to FIG. 12, the rear underside of each guide element 138 is formed with a slot 144 which extends through the guide element and which is aligned with the slots 144 of all other guide elements. The rear wall of each slot 144 is formed with a tapered surface 146 which extends to undersurface 147 of beam 134. The front wall of each slot 144 is formed with a tapered surface 148 which extends to an undersurface 149 of the guide element 138. It is noted that the undersurfaces 149 of the guide elements 138 are recessed upwardly from the plane of undersurface 147 of beam 134 as clearly viewed in FIGS. 13 through 17. Each guide element 138 is formed with upper step surface 150 contiguous with vertical surface 151.

The insertion head 127 further includes a pin-wedging block, designated generally by the numeral 152, which is composed of a high-impact clear plastic material such as polycarbonate and is formed with a chamber-mating surface 153, a recessed surface 154 and a bottom surface 156. An undershoulder surface 157 is formed in block 152 contiguous with surface 153 and surface 154. Block 152 is also formed with a plurality of slots 158 in surface 153. Each slot 158 is formed with a tapered surface 159 and has an opening in undershoulder surface 157. The slots 158 correspond in number and spacing to the number and spacing of the slots 139 of the insertion head 127. Block 152 is further formed with a bevelled edge 160 contiguous with surfaces 154 and 156.

Pin-wedging block 152 is assembled with pin-guiding member 130 as illustrated in FIGS. 13 through 17. In this assembly, slots 158 of block 152 are aligned with the grooves 142. Block 152 is then positioned so that surfaces 153, 157, 154 and 156 of the block are in facing engagement with surfaces 136, 143, 151 and 150, respectively. Block 152 is then secured to member 130 by fastener 161. As viewed in FIGS. 13 through 17, slots 158 of block 152 provide communication between slots 139 of member 130 and chamber 137 of the member.

Referring to FIG. 13, a pair of spaced, countersunk holes 162 (one shown) are formed from top to bottom in cross beam 134. The holes 162 are formed near the junctures where the beam 134 is integrally joined with the columns 132 and 133 (FIG. 4) and immediately behind the plane of the slots 142. Each of the holes 162 supports a shuttle-engaging pin 163 which is formed with a head 164 and axial opening 166. The head 164 of each pin 163 normally rests on the shoulder of the countersunk hole 162 and is held in place by a compression spring 167. Caps 168 (FIG. 4) are secured to the upper surface of columns 132 and 133 and beam 134 to capture springs 167 and pins 162 within holes 162. As illustrated in FIG. 14, the lower portions of pins 163 extend below undersurface 147 of member 130.

Referring to FIG. 18, a pair of spaced, countersunk holes 169 (one shown) are formed from top to bottom through columns 132 and 133 (FIG. 4). A pair of slide-locating pins 171 (one shown) are positioned within the holes 169. Each pin 171 is formed with a head 172 at the upper end and a bullet-shaped nose 173 at the lower end. A pair of compression springs 174 (one shown) are located within the holes 169 and are contained therein by caps 168 (FIG. 4) to normally bias the pins 171 to the position illustrated in FIG. 18. In this position, the head 172 of each pin 171 is seated on the shoulder of the respective countersunk hole 169. Also, a lower portion and the nose 173 of each pin 171 extend below the undersurface 147 of member 130. Ultimately, the shanks 21 of a plurality of pins 20 (FIG. 1) will be located toward the back wall of slots 142 as illustrated in FIGS. 16 and 17. The axial centerline of the pins 20 in this position will lie generally in the plane of the axial centerline of the slide-locating pins 171 (FIG. 18).

As illustrated in FIG. 4, the apparatus 41 further includes a manually operable lever 176 which forms a portion of a pneumatic system (not shown) to control the downward and upward movement of the piston within cylinder 129. A pair of spring-loaded switches 177 and 178 are mounted on the front of table 101 to facilitate operation of the apparatus 41. Referring to FIG. 4, the apparatus 41 further includes a pin-preposition assembly, designated generally by the numeral 183. Assembly 183 includes a bar 184 which is formed with a plurality of spaced, tapered-opening notches 186 on a rear face thereof. The number and spacing of the notches 186 correspond to the number and spacing of pins 20 to be supported by insertion head 127 and the notches will be aligned with the shanks 22 of the pins. Two additional notches 187 are formed at opposite ends of the row of notches 186 and will be aligned with pins 171.

Figure 19:
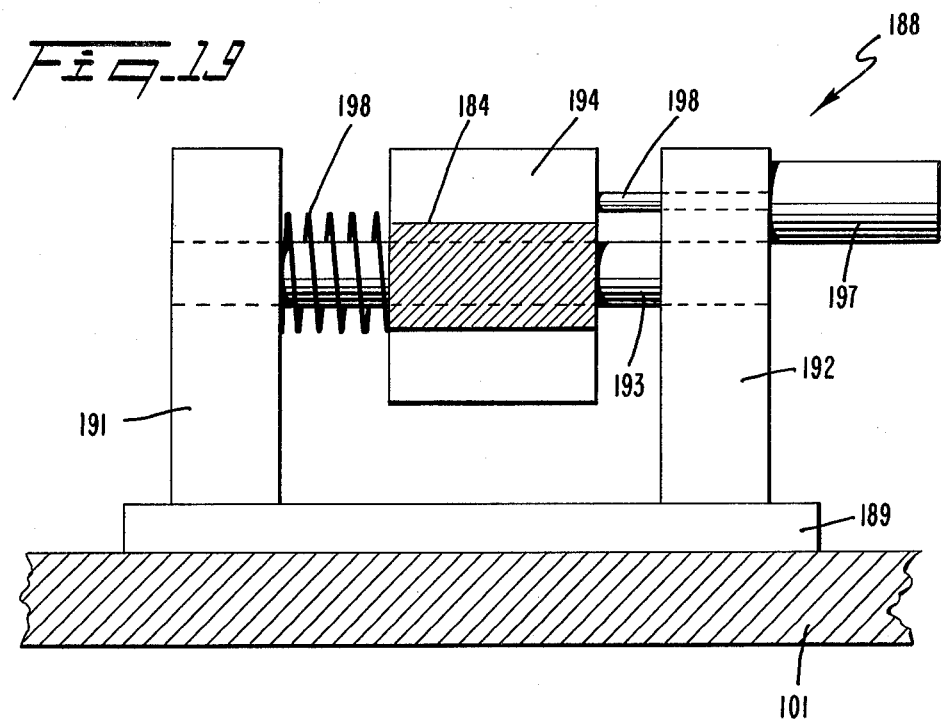
FIG. 19 is a side view showing a bar-actuator assembly which forms a portion of the pin-insertion apparatus of FIG. 5.

Referring to FIGS. 4 and 19, the opposite ends of bar 184 are attached to a pair of bar-actuator assemblies designated generally by the numeral 188. Each assembly 188 includes a platform 189 which is mounted on table 101 and which supports a pair of spaced vertical stands 191 and 192. A slide rod 193 is supported by and extends between the stands 191 and 192. A bar support 194 is mounted for sliding movement on slide rod 193 and is normally urged to the right, as viewed in FIG. 19, and toward the front of table 101, as viewed in FIG. 4, by spring 196. A solenoid-actuated cylinder 197 is mounted on an outer face of stand 192 and has a piston rod 198 which extends through the stand and engages bar support 194. Opposite ends of bar 184 are secured to inwardly facing surfaces of the bar support 194 of the pair of bar-actuator assemblies 188.

Figure 20:
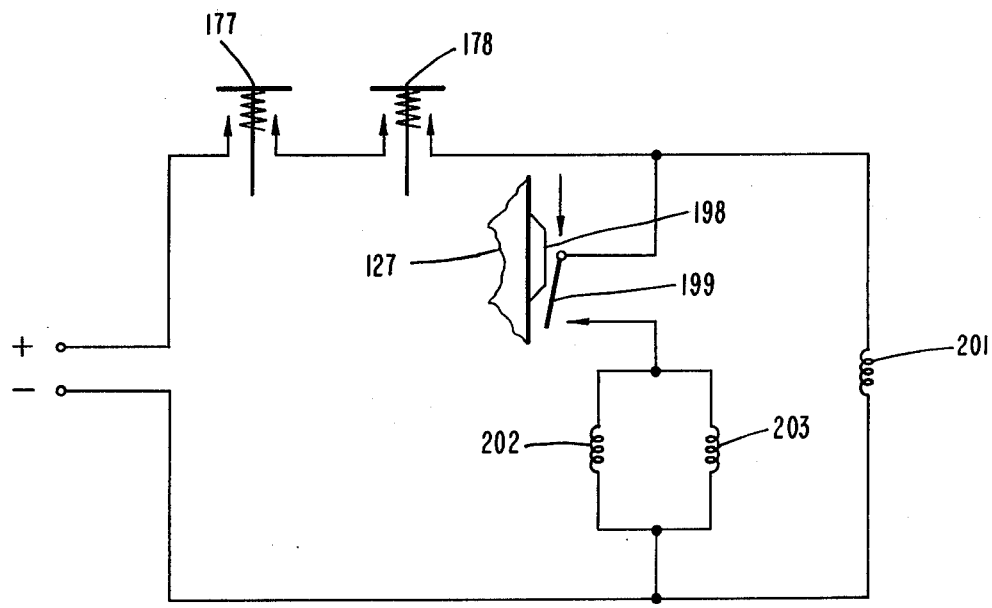
FIG. 20 is an electrical diagram which facilitates control of the operation of the pin-insertion apparatus of FIG. 4.

Referring to FIG. 20, a cam 198 is formed on one side face of insertion head 127 and facilitates operation of switch 199 to control operation of pin-preposition assembly 183 (FIG. 4).

Referring to FIGS. 7, 8 and 9, an operator assembles one of the combs 34 (FIG. 2) or 39 (FIG. 3) of pins 20 with shuttle 42 as previously described. In the case of comb 34, end strips 32 and 33 are removed. In the case of comb 39, body-carrier strips 38 are removed. In either case, pins 20 are now held individually with shuttle 42 in the precise, spaced, parallel alignment previously assumed by the pins in the combs 34 and 39.

Referring to FIG. 14, shuttle 42 is then manipulated by the operator to move the shanks 21 of the shuttle-held pins 20 at the illustrated angle laterally into slots 139 of insertion head 127. Eventually, the operator senses that the upper tips of shanks 21 engage the rear surfaces of grooves 142 as illustrated. It is noted that the wide openings of the slots 139 require only general alignment of the pins 20 with the slots prior to movement of the shanks 21 into the slots. The tapered side walls 141 of slots 139 guide the shanks 21 of pins 20 into the grooves 142 at the base of the slots to the position illustrated in FIG. 14. It is further noted that the bottom surface 156 of block 152 provides an upper wall for the slots 139 and thereby precludes upward movement of the pins 20 as the shanks 21 are being inserted into the slots.

Referring to FIG. 15, the operator then moves shuttle 42 upwardly from the position of FIG. 14 while maintaining the illustrated angular position of the shuttle and shanks 21. Eventually, the upper tip ends of shanks 21 of pins 20 move through the upper ends of respective slots 142 of pin-guiding member 130 and into aligned slots 158 of pin-wedging block 152. The bevelled surface 160 of block 152 and the rounded upper rear edges 165 of slots 142 permit the shanks 21 to move unencumbered into slots 158. Shanks 21, with shuttle 42, are moved upwardly until shoulder surfaces 28 (FIG. 1) of pins 20 engage undersurfaces 149 of guide elements 138 as viewed in FIG. 15. The operator then maneuvers shuttle 42 to move the shoulder surfaces 28 along undersurfaces 149, over tapered surfaces 148 (FIG. 13) and into slots 144 as illustrated in FIG. 16.

At this time, the operator rocks the wedge slide 44 as illustrated in FIG. 10 while continuing to move the shuttle 42 and pins 20 upwardly. As the wedge slide 44 is rocked, the main body 43 and the wedge slide assume the relative position illustrated in FIG. 8. The upper ends of actuator shanks 72 now extend upwardly from upper face 50 of shuttle 42. The lower tip ends of shanks 22 of pins 20 now engage front surface 91 of plate 89 with less frictional force than when the wedge slide 44 was in the withdrawn position illustrated in FIG. 9. As the operator continues the upward movement of shuttle 42 and pins 20, the tip ends of shanks 21 engage the respective tapered surfaces 159 of block 152 and are cammed or deformed into chamer 137 of member 130 as viewed in FIG. 16. Eventually, shoulder surfaces 28 of the lateral ears 26 and 27 (FIG. 1) engage the upper surfaces of slots 144 to preclude further upward movement of pins 20. Since the rear walls of slots 144 are forward of the rear walls of grooves 142, shanks 22 of pins 20 are urged to the right as viewed in FIG. 16. Thus, shanks 22 of pins 20 when fully assembled with insertion head 127 are tilted toward the front of table 101 (FIG. 4).

Referring again to FIG. 16, as the tip ends of shanks 21 are cammed into chamber 137 and the lateral ears 26 and 27 are cammed into slots 144, the pins 20 become wedged frictionally into the insertion head 127 and are held firmly thereby in an assembled relation with the insertion head. The camming of shanks 21 of pins 20 into chamber 137 enhances the forward tilting of shanks 22 and urges ears 26 and 27 of each pin against the wall of slot 144 which is contiguous with tapered surface 148.

Referring further to FIG. 16, as shuttle 42 is moved upwardly by the operator to assemble the pins 20 with insertion head 127, the upper ends of actuator shanks 72 enter openings 166 of pins 163 and the upper face 50 of the shuttle engages and urges pins 163 partially upwardly into holes 162 against the biasing action of springs 167.

When the shoulder surfaces 28 of ears 26 and 27 of pins 20 engage the upper surface of slots 144, as noted above, the shuttle 42 has reached the uppermost position and is sensed by the operator. The operator then relaxes the application of the upward force on the shuttle 42. At this time, the biasing forces of compressed springs 167 are released to cause pins 163 to press downwardly on shuttle 42 whereby the shuttle is moved quickly a short distance away from the insertion head 127 as illustrated in FIG. 17. This rapid movement of shuttle 42 removes the tip ends of shanks 22 of pins 20 from frictional engagement with the shuttle whereby the pins 20 are now fully supported and held by the insertion head 127 as noted above with the shanks extending freely therefrom. The shuttle 42 is completely removed from the area of the insertion head 127 to reveal the shanks 22 extending downwardly from the insertion head with the tips of the shanks angled toward the front of table 101. In this position, the pins 171 and bullet noses 173 extend a greater distance downwardly than the tips of shanks 22.

Referring to FIG. 4, the operator moves the slide assembly 109 to a position whereat the first or next row of empty holes 123 of cover plate 122 is aligned generally with the tips of shanks 22 of pins 20 held by insertion head 127. To assist the operator in generally locating the holes 123 beneath the insertion head 127, a bar 211 is mounted along the upper right edge of base template 111 as illustrated in FIG. 4. The bar 211 is formed with spaced holes or depressions 212 which are aligned with the index holes 116 of the adjacent index bar 113 and thereby with the apertures 23 in board 24 (FIG. 11) and holes 123 of cover plate 122. A feeler arm 213 associated with switch 214 is positioned permanently and generally in alignment with the row of pins 20 mounted in head 127 as illustrated in FIG. 4. The feeler arm 213 senses each approaching depression 212 and, through operation of switch 214, operates a digital counter 216 which is mounted on top of stand 102. The operator observes counter 216 and as the counter advances the next count, the operator knows that slide assembly 109 is now located to position generally the next empty row of holes 123 beneath the freely extending shanks 22 of the pins 20 supported in head 127. In this position, slide-locating pins 171 are located generally over holes 116 of index bars 112 and 113 at opposite ends of the above-mentioned first or next row of empty holes 123. The operator then positions lever 176 to prepare for the application of pneumatic pressure to cylinder 129 to move insertion head 127 downwardly. Thereafter, the operator depresses switches 177 and 178 (FIG. 4) located on the front of table 101.

Depression of switches 177 and 178 facilitates the actuation of solenoid 201 (FIG. 20) to facilitate application of pneumatic pressure to cylinder 129 whereby insertion head 127 is moved downwardly. Eventually, the bullet noses 173 of pins 171 (FIGS. 4 and 18) move into generally aligned holes 116. As insertion head 127 moves further downwardly, pins 171 cause slight movement of slide assembly 109 to accurately align the holes 116 and row of empty holes 123 with the insertion head. As noted above, shanks 22 of pins 20 (FIG. 1) are tilted slightly toward the front of table 101. As the insertion head 127 continues downwardly, shanks 22 are located above but are tilted slightly forward of the row of empty holes 123. Referring to FIG. 20, eventually, cam 198 on head 127 closes switch 199 to facilitate actuation of solenoids 202 and 203 whereby pneumatic pressure is applied to cylinders 197 (FIGS. 4 and 19).

When pressure is applied to air cylinders 197, bar supports 194 are moved slightly toward the rear of table 101. Eventually, notches 186 of bar 184 engage the forwardly tilted shanks 22 of pins 20 and urge the shanks rearwardly of table 101. Thereafter, notches 187 of bar 184 are located about and seat on pins 171 to preclude further rearward movement of the bar. As the bar 184 is being moved rearwardly, the forwardly tilted shanks 22 located in notches 186 are urged rearwardly into alignment with and above the row of empty holes 123. As head 127 continues to move downwardly, the tips of shanks 22 are inserted into holes 123 and into aligned apertures 23 of board 24. The insertion head 127 then engages a microswitch (not shown) which facilitates control of cylinder 129 to stop downward movement of the head.

Referring to FIG. 20, eventually cam 198 passes by switch 199 and solenoids 202 and 203 are deactuated whereby pneumatic pressure is removed from cylinders 197 (FIGS. 4 and 19). Referring to FIGS. 4 and 19, under the biasing action of springs 196, bar 184 is urged to the retracted position. While the bar 184 is being retracted, insertion head 127 continues to be moved further downwardly to complete the insertion of shanks 22 of pins 20 into board 24. Eventually, the undersurface of the insertion head 127 engages the top surface of cover plate 122 to complete downward movement of the head. The operator then moves lever 176 to a position which directs pressure to move insertion head 127 upwardly. The operator then depresses switches 177 and 178 (FIGS. 4 and 20) whereby solenoid 201 (FIG. 20) is actuated to facilitate upward movement of head 127. As the insertion head 127 moves away from the slide assembly 109, the frictional forces which retain the pins 20 with board 24 are sufficient to overcome the wedging forces of the insertion head. In this manner, the pins 20 separate from the head 127 and remain with the slide assembly 109.

Eventually after pins 20 have been assembled with the rows of holes 123, and apertures 23 of board 24, the slide assembly 109 is removed from the front of table 101. The large size of holes 123 permit cover plate 122 to be removed over the lateral ears 26 and 27 and shanks 21 of pins 20 whereafter board 24 can be separated from template 111 and the remainder of the slide assembly 109.

In summary, shuttle 42 provides a means for supporting individual pins 20 in a precise spaced alignment with common shanks 21 extending freely therefrom. The insertion head 127 includes grooves 142 aligned with slots 158 which communicate with chamber 137 all of which form fixed, offset passageways within the insertion head for receiving shanks 21 of the shuttle-supported pins 20. Slots 139 are provided with wide openings and tapered walls 141 which facilitate easy and guiding movement of the shanks 21 of the shuttle-supported pins 20 into slots 142. Slots 158 are formed with tapered surfaces 159 which permit wedging or camming of the tip ends of shanks 21 within the fixed passageways whereby the tip ends of shanks 21 are temporarily deformed. The shuttle 42 is withdrawn and the pins 20 are now fully supported with the head 127 with opposite common shanks 22 extending freely downward in the spaced alignment.

It is feasible that, during assembly of the pins 20 with head 127, some of the shanks 22 may be bent undesirably in random directions and would, therefore, not be aligned with holes 123 of cover plate 122 during insertion of the shanks 22 into the holes. To insure that all shanks 22 are properly aligned with the holes 123, insertion head 127 is formed with slots 144 which receive ears 26 and 27 of pins 20. The rear wall of each slot 144 is offset from and forward of the base of adjacent grooves 142. Thus, as shanks 21 of pins 20 are moved upwardly through grooves 142, the ears 26 and 27 of the pins are cammed into slots 144 and rest against the rear walls of the slots. This causes the shanks 22 of all pins 20 to be angled toward the front of table 101. Thus shanks 22 of all pins 20 are angled forward of the position beneath the pins at which the shanks 22 will be inserted ultimately into holes 123 of cover plate 122 (FIGS. 4 and 11). This forward tilt action also enhances the wedging of pins 20 with head 127.

As the shanks 22 are being moved downwardly for insertion into holes 123 of cover plate 122, bar 184 is moved toward the rear of table 101 to move the tapered-opening notches 186 into engagement with the forward-tilted shanks 22. Any of the shanks 22 which are also bent laterally will be guided into the base of the respective notches 186 by tapered walls of the notches. In any event, all of the shanks 22 are moved by bar 184 into axial alignment with holes 123 of plate 122 positioned beneath the shanks. Bar 184 is maintained in this position while insertion head 127 continues to move downwardly. During this period, the common tip ends of shanks 22 pass through the holes 123 of plate 122 and into apertures 23 of board 24. As head 127 continues downwardly, bar 184 is retracted. Eventually, head 127 engages cover plate 122 and stops. Shanks 22 have now been fully inserted through apertures 23 of board 24 and pins 20 are assembled with the board.

Additional rows of pins 20 are assembled with board 24 in the same manner. Eventually, the pin-populated board 24 is removed from the slide assembly 109.

What is claimed is:

1. A method of simultaneously inserting one end of each of a plurality of individual and unlinked pins into apertures of a support in a precise spaced alignment, which comprises the steps of:

inserting into fixed passageways of a head freely extending common tip ends of the pins, the passageways being spaced in the precise alignment;

wedging into the fixed passageways of the head the freely extending common tip ends of the pins by laterally offsetting the common tip ends within the passageways so that the pins are firmly supported with the head; and moving the head with the wedged pins toward the support until the opposite common tip end of each of the pins is inserted into an aperture of the support.

2. A method of simultaneously inserting one end of each of a plurality of individual and unlinked pins into apertures of a support in a precise spaced alignment, which comprises the steps of:

supporting initially a plurality of individual pins in a precise spaced alignment with common tip ends of the pins extending freely in the spaced alignment;

wedging into fixed passageways of a head the freely extending common tip ends of the supported pins by laterally offsetting the common tip ends within the passageways so that the pins are firmly supported with the head; the passageways being spaced in the precise alignment;

withdrawing the initial supporting of the pins whereby the pins are now fully supported with the head with the opposite common tip ends of the pins extending freely in the spaced alignment; and moving the head with the wedged pins toward the support until the opposite common tip end of each of the pins is inserted into an aperture of the support.

3. The method as set forth in claim 2 wherein the step of supporting includes the steps of:

positioning the opposite common tip ends of the plurality of pins into slots of a pin-supporting shuttle; and placing the shuttle in a locked condition to firmly retain the pins therewith.

4. The method as set forth in claim 3 wherein the pins are integrally joined by strips between adjacent portions of the pins in a comb-like fashion to facilitate gang-assembly of the pins with the shuttle, and which further comprises the step of removing the strips from between the shuttle-supported pins subsequent to placing the shuttle in the locked condition so that the pins are now individually held by the shuttle.

5. The method as set forth in claim 2 wherein each of the fixed passageways of the head includes a first section in alignment with an offset section and wherein the step of wedging includes the steps of:

positioning the common tip ends of the supported pins into the first section of the fixed passageways; and moving the positioned common tip ends into the offset sections to wedge the tip ends into the offset sections whereby the pins are firmly supported with the head.

6. The method as set forth in claim 5 which further comprises the step of guiding laterally and directly the pins into the first section.

7. The method as set forth in claim 5, wherein each pin is formed along an intermediate portion thereof with at least one lateral ear having a shoulder surface, which further comprises the steps of:
- subsequent to positioning the common tip ends into the first section, moving the common tip ends through the first section until the shoulder surfaces of the pins engage an undersurface of the head;
- moving the shuttle laterally adjacent to the undersurface of the head until the shoulder surfaces of the pins are positioned adjacent to slots formed in the undersurface of the head; and
- moving the lateral ears of the pins into the slots until the shoulder surfaces engage upper surfaces of the slots whereby, during the period when the shoulder surfaces are moving into the slots, the common tip ends of the pins move into the offset section of the head to wedge the tip ends into the offset section.

8. The method as set forth in claim 2 which further comprises the step of tilting the opposite common tip ends of the pins in a common direction away from the head.

9. The method as set forth in claim 3 wherein the step of withdrawing the initial supporting comprises the steps of:
- placing the shuttle in an unlocked condition to relieve shuttle support of the pins; and
- withdrawing the shuttle from a position about the opposite common tip ends of the pins so that the opposite common tip ends extend freely in the spaced alignment.

10. The method as set forth in claim 8 which further comprises the step of moving the tilted opposite common tip ends of the pins into a position over apertures of the support.

11. The method as set forth in claim 10 wherein the step of moving the tilted opposite common tip ends is effected as the head is being moved toward the support.

12. The method as set forth in claim 10 wherein the step of moving the tilted opposite common tip ends comprises the steps of:
- moving a pin-preposition bar into engagement with the tilted opposite common tip ends as the head is being moved toward the support to move the tip ends into alignment with apertures in the support; and
- withdrawing the pin-preposition bar subsequent to insertion of the tip ends into apertures of the support.

13. The method as set forth in claim 12 wherein the step of moving the head continues subsequent to the step of withdrawing the pin-preposition bar to fully insert the pins into the apertures of the support.

14. The method as set forth in claim 10 wherein the step of moving the tilted tip ends further comprises the step of moving laterally any of the tilted tip ends to the position over the apertures of the support where such pins are also laterally displaced relative to the head.

15. A method of simultaneously inserting one end of each of a plurality of individual and unlinked pins into apertures of a support in a precise spaced alignment, which comprises the steps of:
- positioning first common tip ends of a plurality of pins into slots of a pin-supporting shuttle in the spaced alignment with opposite common tip ends of the pins extending freely therefrom in the spaced alignment;
- placing the shuttle in a locked condition to firmly retain the pins therewith;
- moving the positioned opposite common tip ends into offset sections of fixed passageways of a head to wedge the opposite common tip ends into the offset sections whereby the pins are firmly supported with the head;
- tilting the first common tip ends of the pins in a common direction away from the head;
- placing the shuttle in an unlocked condition to relieve shuttle support of the pins;
- withdrawing the shuttle from a position about the first common tip ends of the pins so that the first common tip ends extend freely in the spaced alignment from the head;
- moving the head with the wedged pins toward the support until the first common tip end of each of the pins is inserted into an aperture of the support; and
- moving the tilted first common tip ends of the pins into a position over apertures of the support as the head is being moved toward the support.

16. Apparatus for simultaneously inserting one end of each of a plurality of individual and unlinked pins into apertures of a support in a precise spaced alignment, which comprises:
- a stand;
- a pin-insertion head attached to the stand and having fixed passageways arranged in the spaced alignment for receiving therein freely extending common tip ends of the pins;
- means formed on the pin-insertion head for laterally offsetting the freely extending common tip ends of the pins in the fixed passageways of the head to wedge the pins within the head; and
- means mounted on the stand for moving the head with the wedged pins toward the support until the opposite tip end of each of the pins is inserted into an aperture of the support.

17. Apparatus for simultaneously inserting one end of each of a plurality of individual and unlinked pins into apertures of a support in a precise spaced alignment, which comprises:
- means for supporting initially a plurality of individual and unlinked pins in the precise spaced alignment with common tip ends of the pins extending freely in the spaced alignment;
- a stand;
- a pin-insertion head movably attached to the stand having fixed passageways arranged in the spaced alignment;
- the supporting means being located near the pin-insertion head and being operatively associated with the head by being movable with the supported pins to position the freely extending common tip ends of the pins into the fixed passageways of the head;
- means formed on the pin-insertion head for laterally offsetting the freely extending common tip ends of the supported pins as the pins are moved into the fixed passageways of the head to wedge the pins within the head;

means located on the supporting means for releasing the support of the pins by the supporting means to permit the withdrawing of the initial supporting means from the pins whereby the pins are now fully supported with the head with the opposite common tip ends of the pins extending freely in the spaced alignment; and means mounted on the stand for moving the head with the wedged pins toward the support until the opposite tip end of each of the pins is inserted into an aperture of the support.

18. The apparatus as set forth in claim 17 wherein the supporting means includes:

a pin-supporting shuttle having a plurality of slots in the spaced alignment for receiving the common tip ends of the pins; and means for placing the shuttle in a locked condition to firmly retain the pins therewith.

19. The apparatus as set forth in claim 17 which further comprises means for guiding laterally and directly the pins into the fixed passageways.

20. The apparatus as set forth in claim 17 wherein each of the fixed passageways of the head includes a first section in alignment with an offset section, wherein the wedging means comprises:

means for limiting movement of the common tip end of each of the pins into the respective first section of the fixed passageway; and means for thereafter permitting limited additional movement of the common tip end of each of the pins beyond the respective first section and into wedging engagement with the aligned offset section.

21. The apparatus as set forth in claim 20, wherein each pin is formed along an intermediate portion thereof with at least one lateral ear having a shoulder surface, and wherein:

the limiting movement means comprises an undersurface of the head adjacent to the first sections of the fixed passageways positioned to engage the shoulder surfaces of the pins as the common tip ends are moved into the first sections; and wherein:

the permitting means comprises slots formed in the undersurface of the head adjacent to the first sections which permit the lateral ears of the pins to move for a limited distance into the slots until the shoulder surfaces engage upper surfaces of the slots whereby, during the period when the shoulder surfaces are moving through the slots, the common tip ends of the pins move into the offset section of the head to wedge the tip ends into the offset section.

22. The apparatus as set forth in claim 17 which further comprises means for tilting the opposite common tip ends of the pins in a common direction away from the head.

23. The apparatus as set forth in claim 18 which further comprises:

means for placing the shuttle in an unlocked condition to relieve shuttle support of the pins.

24. The apparatus as set forth in claim 22 which further comprises means for moving the tilted opposite common tip ends of the pins into a position over apertures of the support.

25. The apparatus as set forth in claim 24 wherein the means for moving the tilted opposite common tip ends comprises:

a pin-reposition bar;

means for moving the pin-preposition bar into engagement with the tilted opposite common tip ends as the head is being moved toward the support to move the tip ends into alignment with apertures in the support; and means for withdrawing the pin-preposition bar subsequent to insertion of the tip ends into apertures of the support.

26. The apparatus as set forth in claim 24 wherein the means for moving the tilted tip ends further comprises means for moving laterally any of the tilted tip ends to the position over the apertures of the support where such pins are also laterally displaced relative to the head.

27. Apparatus for simultaneously inserting one end of each of a plurality of individual and unlinked pins into apertures of a support in a precise spaced alignment, which comprises:

a pin-supporting shuttle having slots arranged in the spaced alignment;

means formed in the pin supporting shuttle for guiding first common tip ends of a plurality of pins into the slots of the pin-supporting shuttle in the spaced alignment with opposite common tip ends of the pins extending freely therefrom in the spaced alignment;

means located within the shuttle for placing the shuttle in a locked condition to firmly retain the pins therewith;

a frame;

a pin-insertion head movably attached to the frame and formed with a plurality of fixed passageways arranged in the spaced alignment;

the pin-supporting shuttle being located near the pin-insertion head and being operatively associated with the head by being movable with the firmly retained pins to position the freely extending opposite common tip ends of the pins into the fixed passageways of the head;

means formed on the pin-insertion head for offsetting laterally the opposite common tip ends as the ends are moved into the fixed passageways of the head to wedge the opposite common tip ends into the head whereby the pins are firmly supported with the head;

means formed on the head for tilting the first common tip ends of the pins in a common direction away from the head;

means located on the pin-supporting shuttle for placing the shuttle in an unlocked condition to relieve shuttle support of the pins whereby the shuttle can be withdrawn from a position about the first common tip ends of the pins so that the first common tip ends extend freely in the spaced alignment from the head;

means mounted on the frame for moving the head with the wedged pins toward the support; and means mounted on the frame for moving the tilted first common tip ends of the pins laterally into a position over apertures of the support as the head is being moved toward the support where, upon continued movement of the head by the moving means, the first common tip end of each of the pins is inserted into an aperture of the support.

* * * * *